(12) United States Patent
Yamada

(10) Patent No.: US 6,399,481 B1
(45) Date of Patent: Jun. 4, 2002

(54) METHOD FOR FORMING RESIST PATTERN

(75) Inventor: Kazuya Yamada, Kitakaturagi (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/368,587

(22) Filed: Aug. 5, 1999

(30) Foreign Application Priority Data

Sep. 14, 1998 (JP) .......................................... 10-260400

(51) Int. Cl.[7] .......................................... H01L 21/4763
(52) U.S. Cl. ...................... 438/636; 438/624; 438/780; 438/952
(58) Field of Search .................. 438/624, 636, 438/725, 758, 778, 780, 781, 948, 949, 952; 430/5, 512

(56) References Cited

U.S. PATENT DOCUMENTS 5,514,526 A * 5/1996 Nishi et al. .................. 430/325
5,688,365 A * 11/1997 Ogoshi ........................ 438/736
5,985,519 A * 11/1999 Kakamu et al. ............. 430/313

FOREIGN PATENT DOCUMENTS

JP 06216023 A 8/1994
JP 07078747 A 3/1995

* cited by examiner

Primary Examiner—Carl Whitehead, Jr.
Assistant Examiner—Maria Guerrero
(74) Attorney, Agent, or Firm—Nixon & Vanderhye P.C.

(57) ABSTRACT

A method for forming a resist pattern includes the steps of: forming an underlayer transparent film on a semiconductor substrate; forming a resist film on the transparent film to a thickness set to be $m\cdot\lambda/2n_2$, where $\lambda$ is an exposure wavelength, $n_2$ is a refractive index of the resist film, and m is an integer from 5 to 30; applying a water-soluble antireflection film on the resist film to a thickness set to be $\lambda/4n_1$, where $n_1$ is a refractive index of the antireflection film; and exposing the resist film from above the antireflection film by a beam having a wavelength $\lambda$ and developing the resist film as well as removing the antireflection film.

16 Claims, 4 Drawing Sheets

METHOD FOR FORMING RESIST PATTERN

CROSS-REFERENCE TO RELATED APPLICATION

This application is related to Japanese patent application No. HEI10(1998)-260400 filed on Sep. 14, 1998 whose priority is claimed under 35 USC §119, the disclosure of which is incorporated herein by reference in its entirety.

BACKGROUND OF THE INVENTION

1. Field of the Invention

The present invention relates to method for forming a resist pattern, and more particularly to a method for forming a resist pattern having a high dimension controllability in manufacturing a semiconductor device or an integrated circuit.

2. Description of the Related Art

In recent years, miniaturization of patterns is taking place at an accelerated speed in accordance with improvements in integration of semiconductor devices. Naturally, as the miniaturization of the patterns proceeds, a higher dimension controllability of resist patterns is demanded.

Generally, in the case where a resist film applied on a substrate is exposed to light, the light incident into the resist film is repeatedly reflected between a resist film/substrate interface and a resist film/air interface. Due to an interference caused by this multi-reflection of light, a stationary wave is formed in the resist film. In accordance therewith, the amount of light absorbed into the resist film changes periodically in the film. This leads to generation of a distribution in the amount of photolysis of a photosensitive substance and, therefore, to a variation in the dimension of the resist pattern.

Moreover, the intensity of light at a node of the stationary wave changes periodically in accordance with the thickness of the resist film. Therefore, the Eth (the minimum amount of exposure that enables development) of the resist film draws a swing curve that fluctuates with a period of $\lambda/2n$ ($\lambda$ is an exposure wavelength and n is a refractive index of the resist film) with respect to the thickness of the resist film, as shown in FIG. 6. Therefore, the fluctuation in the thickness of the resist film changes the dimension of the resist pattern.

The thickness of a resist film on an actual device fluctuates locally due to underlayer step differences. Therefore, it is important to reduce the oscillation amplitude of a swing curve (i.e. the stationary wave effect) in view of improving the dimension controllability. Especially, as the exposure wavelength becomes shorter, the reflected light from the underlying substrate becomes stronger, thereby increasing the stationary wave effect. Accordingly, how the oscillation amplitude of the swing curve can be reduced is a problem to be solved in the future.

In order to solve such a problem, the BARC (Bottom Anti-Reflective Coating) method, for example, is proposed. This method is directed to reduction of the effects of multi-reflection in a resist film by reducing the reflectivity at the resist film/substrate interface. Specifically, an antireflection film is formed on a substrate, and a resist is applied thereon.

However, since the antireflection film is located under the resist film in this method, it is necessary to further pattern the antireflection film by means of a developer solution or $O_2$ plasma after a pattern is formed in the resist film. This may lead to increased number of manufacturing steps and to a larger line width shift or variation.

As another method, the TARC (Top Anti-Reflective Coating) method is proposed. This method is directed to reduction of the effects of multi-reflection in a resist film by adjusting the thickness of the antireflection film to allow the phase of the light beam reflected at the resist film/antireflection film interface to be shifted by 180° from the phase of the light beam reflected at the antireflection film/air interface so as to cancel these two light beams with each other. Specifically, a water-soluble antireflection film containing PVA (polyvinyl alcohol) as a major component is formed on a resist film, which is then exposed and developed to form a resist pattern.

By this method, the antireflection film may be removed simultaneously in the developing step, so that a required additional step is only the step of applying the antireflection film.

FIG. 5 shows a relationship between the thickness and the Eth of the resist film when an antireflection film is formed on the resist film by means of the TARC method.

From FIG. 5, it will be understood that the value of the stationary wave effect is reduced to about half of the value of the stationary wave effect shown in FIG. 6 where the antireflection film is not used.

However, by this method, the swing curve still has an oscillation amplitude, even though the value of the stationary wave effect may be reduced by 50%.

On the other hand, it is known in the art that, if a transparent film such as $SiO_2$ or SiN is used as an underlayer for the resist film, the amount of light absorbed into the resist film fluctuates with a period of $\lambda/2n$ ($\lambda$ is an exposure wavelength and n is a refractive index of the underlayer transparent film) in accordance with the variation in the thickness of the underlayer transparent film irrespective of the presence or absence of the antireflection film on the resist film, in the same manner as the case where the thickness of the resist film varies.

FIG. 7 shows a relationship between the thickness of the $SiO_2$ film as the underlayer transparent film and the Eth of the resist film when the thickness of the resist film has, for example, a constant value of 1.05 $\mu$m.

From FIG. 7, it will be understood that the period is about 0.12 $\mu$m if the exposure wavelength is an i-line beam (0.365 nm) Also, if the thickness of the underlayer transparent film varies by about 0.06 $\mu$m corresponding to half of the period, there is a possibility that the stationary wave effect fluctuates to the maximum extent. Therefore, in order to avoid this, the variation in the thickness of the underlayer transparent film must be limited to be less than a thickness that corresponds to half of the period.

However, if an $SiO_2$ film 3 is formed, for example, to a thickness of about 1.0 $\mu$m as an interlayer dielectric film on a substrate 1 having a gate electrode 2 of about 0.2 $\mu$m thickness formed thereon as shown in FIG. 4, the thickness of the $SiO_2$ film 3 varies by about ±0.1 $\mu$m. If a contact hole is to be formed simultaneously on the gate electrode 2 and the substrate 1, the thickness difference of the $SiO_2$ film 3 under the resist film 4 is 0.4 $\mu$m at the maximum. Therefore, in principle, it is impossible to control the variation of the thickness of the underlayer transparent film to be less than about 0.06 $\mu$m.

The present invention has been made in view of these circumstances and the purpose thereof is to reduce the difference between the maximal value and the minimal value of the Eth of the resist film with respect to the variation in the thickness of the underlayer transparent film by controlling the thickness of the resist film and the thickness of the antireflection film, thereby to provide a resist pattern with improved dimension controllability.

SUMMARY OF THE INVENTION

Accordingly, the present invention provides a method of forming a resist pattern with a high dimension controllability, comprising the step of: forming an underlayer transparent film on a semiconductor substrate; forming a resist film on the transparent film to a thickness set to be $m\cdot\lambda/2n_2$, where $\lambda$ is an exposure wavelength, $n_2$ is a refractive index of the resist film, and m is an integer from 5 to 30; applying a water-soluble antireflection film on the resist film to a thickness set to be $\lambda/4n_1$, where $n_1$ is a refractive index of the antireflection film; and exposing the resist film from above the antireflection film by a beam having a wavelength $\lambda$ and developing the resist film as well as removing the antireflection film.

Further, the present invention provides a method for forming a resist pattern with a high dimension controllability, comprising the steps of: forming an underlayer transparent film on a semiconductor substrate; forming a resist film on the transparent film to a thickness set to be $(2m+1)\cdot\lambda/4n_2$, where $\lambda$ is an exposure wavelength, $n_2$ is a refractive index of the resist film, and m is an integer from 5 to 30; and exposing by a beam having a wavelength $\lambda$ and developing the resist film.

Also, the present invention provides a substrate capable of forming a resist pattern having a high dimension controllability, the substrate comprising an underlayer transparent film, a resist film, and a water-soluble antireflection film formed successively on a semiconductor substrate, wherein the resist film has a thickness set to be $m\cdot\lambda/2n_2$, where $\lambda$ is an exposure wavelength, $n_2$ is a refractive index of the resist film, and m is an integer from 5 to 30; and the water-soluble antireflection film has a thickness set to be $\lambda/4n_1$, where $n_1$ is a refractive index of the antireflection film.

Still further, the present invention provides a substrate capable of forming a resist pattern having a high dimension controllability, the substrate comprising an underlayer transparent film and a resist film formed successively on a semiconductor substrate, wherein the resist film has a thickness set to be $(2m+1)\cdot\lambda/4n_2$, where $\lambda$ is an exposure wavelength, $n_2$ is a refractive index of the resist film, and m is an integer from 5 to 30.

BRIEF DESCRIPTION OF THE DRAWINGS

The present invention will be better understood from the following detailed description of preferred embodiments of the invention, taken in conjunction with the accompanying drawings, in which.

DETAILED DESCRIPTION OF THE PREFERRED EMBODIMENTS

Figure 1:
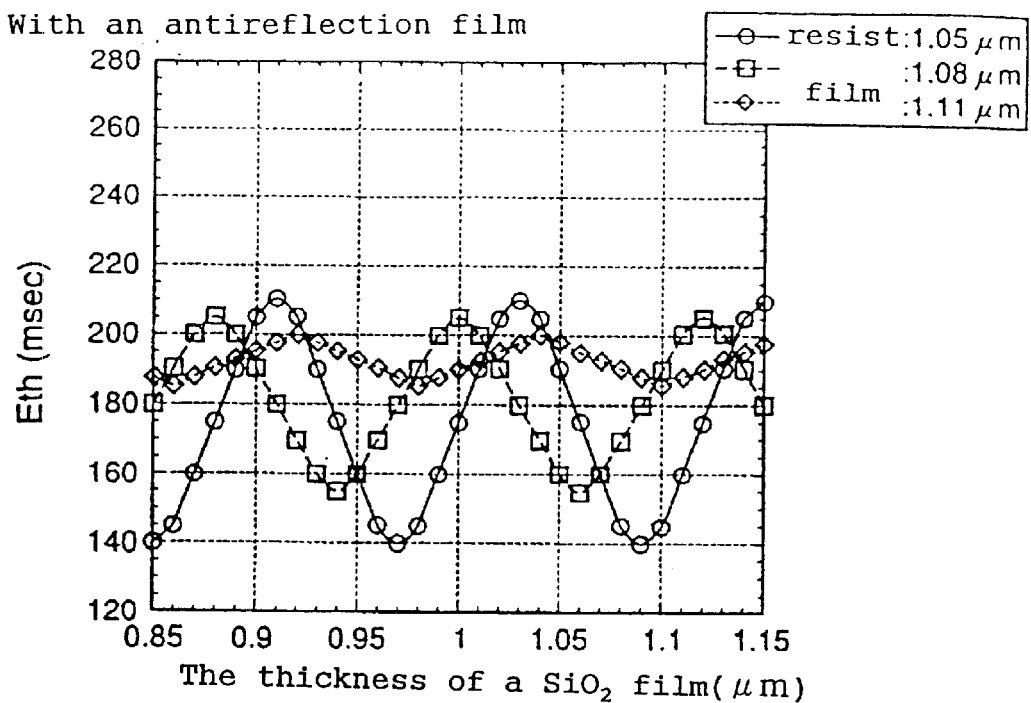
FIG. 1 is a graph showing a relationship between the thickness of a $SiO_2$ film and the Eth of a resist film when an antireflection film is used.

In the present invention, the semiconductor substrate is not specifically limited as long as it is a substrate typically used in forming a semiconductor device. The material of the semiconductor substrate maybe, for example, a semiconductor such as silicon or germanium, or a compound semiconductor such as GaAs or InGaAs. Among these materials, silicon is preferable. The semiconductor substrate may include elements such as a transistor, a capacitor, or a resistor, a circuit formed by a combination thereof, a metal interconnect layer, or the like formed on a surface of the semiconductor substrate. Further, the semiconductor substrate may include a dielectric film such as an interlayer dielectric film.

First, an underlayer transparent film is formed on a semiconductor substrate. The underlayer transparent film at this time is not specifically limited as long as the k value (light-quenching factor) of the underlayer transparent film is less than about 0.01 with respect to the exposure wavelength. The underlayer transparent film may be any of an insulating film, a dielectric film, a ferroelectric film, and an electrically conductive film. Specifically, the insulating film may be an $SiO_x$ film, an $Si_yN_z$ film or the like; the dielectric film may be an SOG film, an HSQ film, a polyimide film or the like; the ferroelectric film may be a PZT film or the like; and the electrically conductive film may be an ITO film or the like. The thickness of the underlayer transparent film is not specifically limited as long as the above-mentioned light-quenching factor is ensured. For example, in the case of an $SiO_x$ film or an $Si_yN_z$ film, the film may have a thickness of less than about 5 $\mu$m, preferably 0.1 to 3.0 $\mu$m. The underlayer transparent film may be formed by a known method, for example, the CVD method, the sputtering method, the vacuum vapor deposition method, the sol-gel method, the EB method, or the like in accordance with the type of the film.

Subsequently, a resist film is formed to a thickness set to be $m\cdot\lambda/2n_2$ ($\lambda$ is an exposure wavelength, $n_2$ is a refractive index of the resist film, and m is an integer) on the underlayer transparent film.

The resist film may be formed of either a positive type or a negative type resist as long as it is a resist generally used in a photolithography process. The resist may be, for example, a cyclized rubber, a polyvinyl cinnamate resin, or a novolak resin. Since the resist film has a good film thickness controllability, it is preferable to form the resist film or, the underlayer transparent film by the spin coating method. The resist film has a thickness of $m\cdot\lambda/2n_2$. Here, the integer m is preferably 5 to 30 in view of practical application. The thickness is, for example, about 0.55 to 3.30 nm. By setting such a thickness, the fluctuation in the sensitivity (Eth) of the resist film with respect to variation in the thickness of the underlayer transparent film may be controlled, thereby improving the line width controllability. The refractive index $n_2$ of the resist film is preferably within the range of 1.63 to 1.67.

Here, the thickness of the resist film may be determined as a thickness value at which the variation in the Eth attains its minimum in the relationship of the Eth to the thickness of the SiO$_2$ film (See FIGS. 1 and 2) on the basis of later-mentioned simulation results shown in FIG. 3.

Further, a waiter-soluble antireflection film is formed to a thickness set to be $\lambda/4n_1$ ($n_1$ is a refractive index of the antireflection film) on the resist film.

The antireflection film is preferably formed of a water-soluble material, i.e. a material that can be removed by means of a developer solution to be used in a later-mentioned step of developing; the resist film. For example, the antireflection film may be formed of a material containing PVA (polyvinyl alcohol) as a major component. Also, the antireflection film is preferably transparent. Since the antireflection film has a good film thickness controllability, it is preferable to form the antireflection film on the resist film by the spin coating method. The thickness of the antireflection film is $\lambda/4n_1$, because it is necessary to set the thickness of the antireflection film to be the minimum thickness that can attain the phase difference of 180°. By setting such a thickness, the fluctuation in the sensitivity (Eth) of the resist film with respect to the variation in the thickness of the underlayer transparent film may be controlled, thereby improving the line width controllability. The refractive index $n_1$ of the antireflection film is preferably within the range of 1.4 to 1.5. The thickness of the antireflection film is, for example, 60 to 70 nm.

Subsequently, the resist film is exposed from above the antireflection film, followed by developing the resist film. In the developing step, the antireflection film is removed. The exposing and developing steps may be carried out in the same manner as the method typically conducted in a photolithography step. The exposure maybe carried out, for example, by means of an i-line beam (0.365 nm), a g-line beam (0.436 nm), a KrF beam (0.248 nm), an ArF beam (0.193 nm) or the like, although the beam to be used may vary in accordance with the resist material to be used and the dimension to be obtained. The developing step may be carried out by any process as long as it can develop or remove both the resist material and the antireflection film material, although the process may vary in accordance with the resist material and the antireflection film material to be used. For example, the developing step may be carried out by means of paddle development or dipping development using an alkali developer solution (TMAH)

Alternatively, in the present invention, use of an antireflection film may be omitted. In such a case, an underlayer transparent film may be formed on a semiconductor substrate, a resist film may be formed thereon, and the resist film may be exposed/developed.

The semiconductor substrate and the underlayer transparent film in this case may be formed of the same material and in the same manner as in the above-mentioned case.

Also, the resist film in this case may Be formed of the same material and in the same manner as in the above-mentioned case. However, in this case, it is necessary to set the thickness of the resist film to be $(2m+1)\cdot\lambda/4n2$ ($\lambda$ is an exposure wavelength, $n_2$ is a refractive index of the resist film, and m is an integer) In other words, the thickness of the resist film must be set at a value which is shifted by half of the period as compared with the above-mentioned case in which the antireflection film is used. By setting such a thickness, the fluctuation in the sensitivity (Eth) of the resist film with respect to variation in the thickness of the underlayer transparent film may be controlled, thereby improving the line width controllability.

Here, the thickness of the resist film may be determined as a thickness value at which the variation in the Eth attains its minimum in the relationship of the Eth to the thickness of the SiO$_2$ film on the basis of later-mentioned simulation results.

The exposure/development of the resist film may be carried out in the same manner as described above.

Hereafter, the; method of forming a resist pattern according to the present invention will be explained on the basis of Test Examples and Embodiments.

TEST EXAMPLES

This Test Example made use of a simulation in which an underlayer transparent film of SiO$_2$, a resist film, and an antireflection film were successively laminated on a silicon substrate. The thickness of the resist film was allowed to change so that the smallest difference between the maximal value and the minimal value (hereafter referred to as "stationary wave effect") would be attained in the graph of the Eth of the resist film with respect to the thickness of the SiO$_2$ film.

The parameters in this case were as follows:
Exposure (i-line beam): $\lambda=0.365$ nm, NA=0.57,
Resist film: n=1.645, a=0.94, b=0.05, c=0.013,
Antireflection films: n=1.410, k=0.000
SiO$_2$: n=1.474, k=0.000
Si: n=6.522, k=2.705
($\lambda$ is an exposure wavelength; NA is a numerical aperture of a lens; n is a refractive index; and a, b, c are Dill parameters to be used in the simulation of a resist image; and k is a light-quenching factor).

Here, the thickness of the antireflection film must be such that the phase of the light beam reflected at the resist film/antireflection:film interface is shifted by 180° from the phase of the light beam reflected at the antireflection film/air interface so as to cancel these two light beams with each other for reducing the effects of multi-reflection in the resist film. Accordingly, the thickness of the antireflection film is set to be $\lambda/4n$ ($n_1$ is a refractive index of the antireflection film) in the same manner as in the case where total reflection is realized at an interface between the resist film and the substrate. This may reduce the stationary wave effect to the maximum extent.

In the case where the exposure was carried out by using the i-line beam (0.365 nm), the thickness of the antireflection film was set to be 0.064 $\mu$m.

FIG. 1 shows a relationship between the thickness of an SiO$_2$ film and the Eth of a resist film when the thickness of the resist film was varied.

From FIG. 1, it will be understood that the dependency of the Eth of the resist film on the thickness of the SiO$_2$ film is small when the thickness of the resist film is near 1.11 $\mu$m, showing an improvement in reducing the stationary wave effect.

As another Test Example, a simulation was used in which an underlayer transparent film of SiO$_2$ and a resist film were laminated and no antireflection film was disposed. The thickness of the resist film was changed so that the stationary wave effect would be the smallest in the graph showing a relationship of the Eth of the resist film with respect to the thickness of the SiO$_2$ film. The results are shown in FIG. 2.

Figure 2:
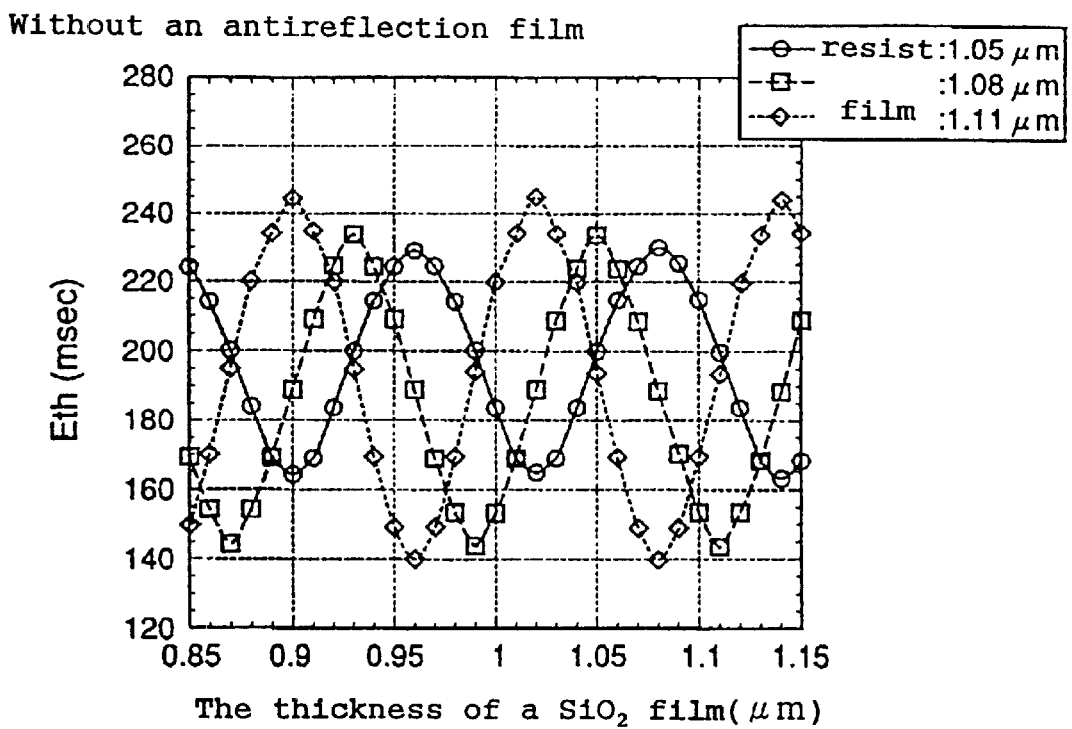
FIG. 2 is a graph showing a relationship between the thickness of a $SiO_2$ film and the Eth of a resist film when an antireflection film is not used.
Figure 3:
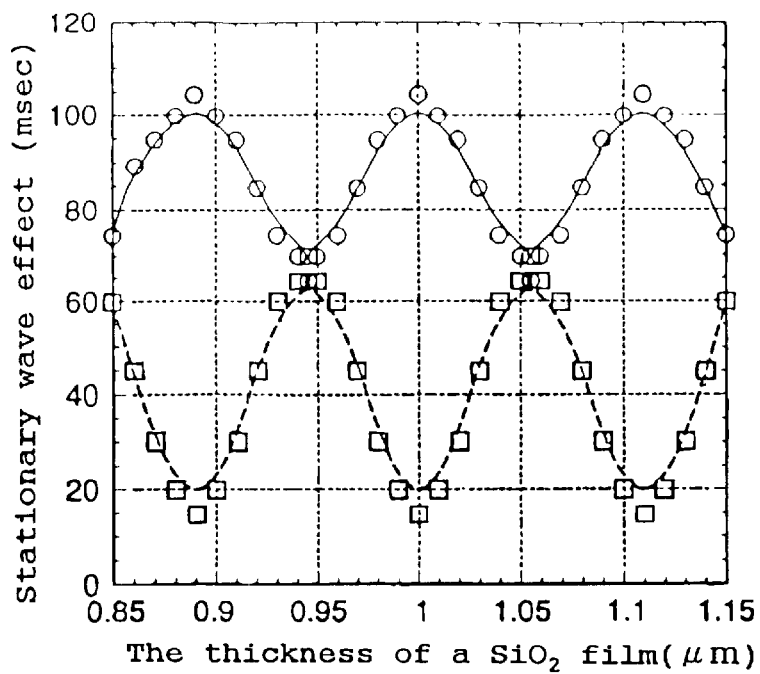
FIG. 3 is a graph showing a relationship between a stationary wave effect and the thickness of a resist film on an $SiO_2$ film.

Further, FIG. 3 shows a relationship of the stationary wave effect on the SiO$_2$ film when the thickness of the resist film was changed in accordance with the presence or absence of the antireflection film from the results of FIGS. 1 and 2.

From FIG. 3, it will be understood that, with the thickness of the resist film being 1 $\mu$m, the stationary wave effect is 15 msec in the case where an antireflection film (0.064 μm) is present, whereas the stationary effect is 105 msec in the case where an antireflection film is not present. This shows that, in the case where the antireflection film is present, the stationary wave effect can be reduced by 85% as compared with the case where the antireflection film is not present.

Also, with the -thickness of the resist film being 1 μm, the stationary wave effect is 105 msec in the case where an antireflection film is not present. If the thickness of the resist film is changed to 1.05 μm, the stationary wave effect is 70 msec. Therefore, it will be understood that the stationary wave effect can be reduced by about 33% by changing the thickness of the resist film from 14 μm to 1.05 μm.

From the above results, it has been confirmed that, when an antireflection film is used, the smallest stationary wave effect can be obtained by setting the thickness of the resist film to be $m \cdot \lambda/2n_2$ ($n_2$ is a refractive index of the resist film and m is an integer) at which the Eth attains its maximal value in the relationship between the Eth and the thickness of the resist film on the bare-Si.

In other words, if the antireflection film is used, the period is $\lambda/2n_2 = 0.365/(2 \cdot 1.645) = 0.111$ μm. The film thickness X μm that gives the smallest stationary wave effect appears with that period and, assuming an offset to be A, the film thickness is represented by $X = A + \lambda/2n_2 \cdot n$. From FIG. 3, it is found out that X=1.00 when n, and X=1.11 when (n+1), so that A≈0. Therefore, the following equation holds: $X = \lambda/2n_2 \cdot n = \lambda/4n_2 \cdot 2m$.

On the other hand, if the antireflection film is not used, it has been confirmed that the stationary wave effect can be reduced by setting the thickness of the resist film to be $(2m+1) \cdot \lambda/4n_2$ ($n_2$ is a refractive index of the resist film).

In other words, if the antireflection film is not used, the equation $A = \lambda/4n_2$ holds, so that $X = \lambda/4n_2(2m+1)$ Embodiments In this embodiment, a resist pattern was actually formed on a wafer so as tic confirm the above-mentioned effect of the Test Examples, and the stationary wave effect of the resist film and the variation in the line width were evaluated.

Figure 4:
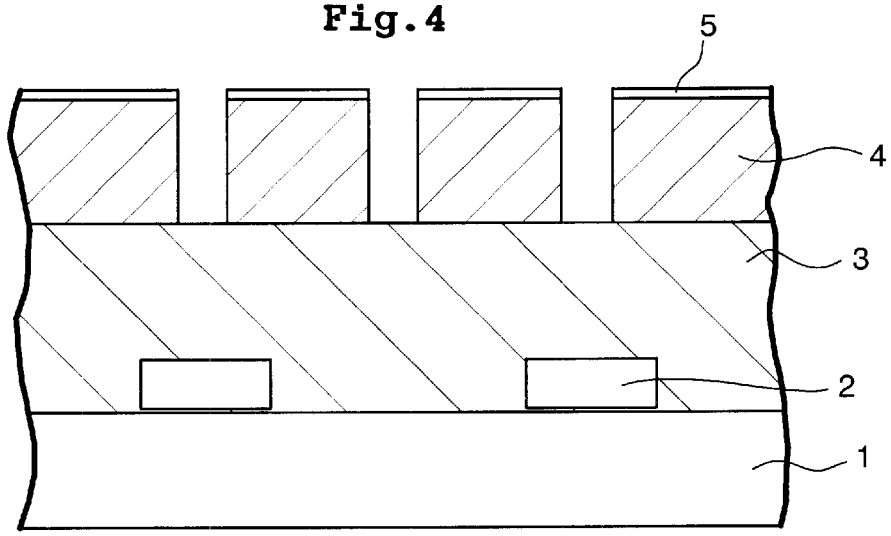
FIG. 4 is a schematic cross-sectional view showing an essential portion of a semiconductor substrate on which a resist pattern is formed according to the present invention.
Figure 5:
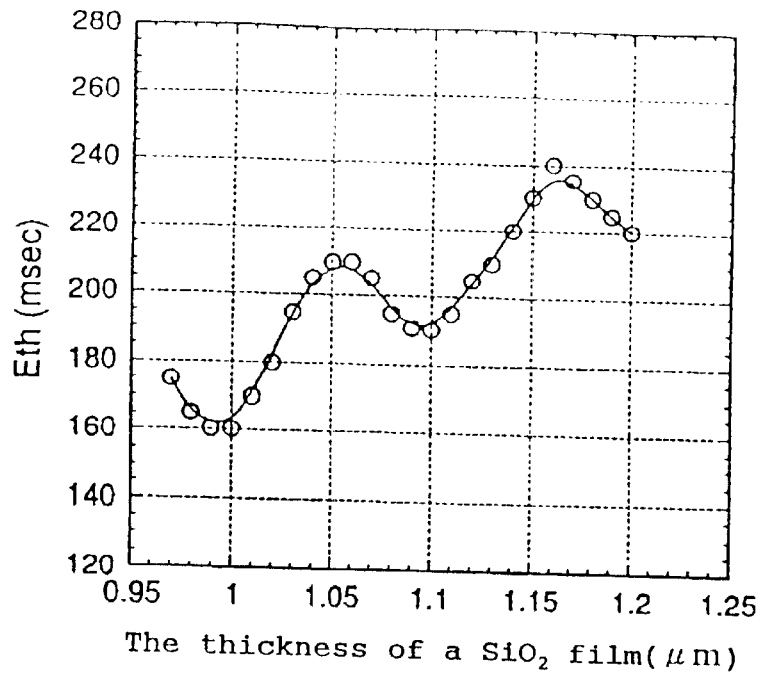
FIG. 5 is a graph showing a relationship between the thickness of a resist film and the Eth of the resist film when an antireflection film is used.
Figure 6:
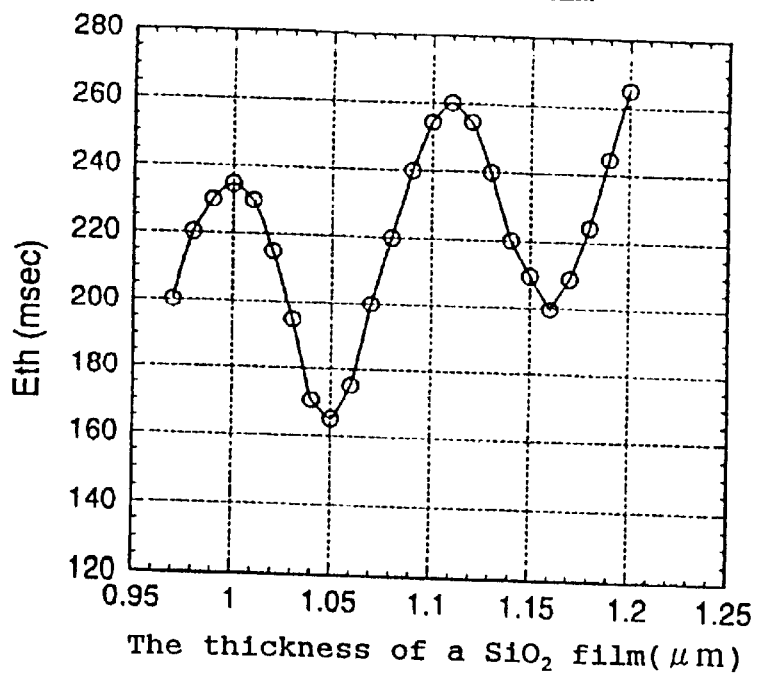
FIG. 6 is a graph showing a relationship between the thickness of a resist film and the Eth of the resist film when an antireflectionl film is not used.
Figure 7:
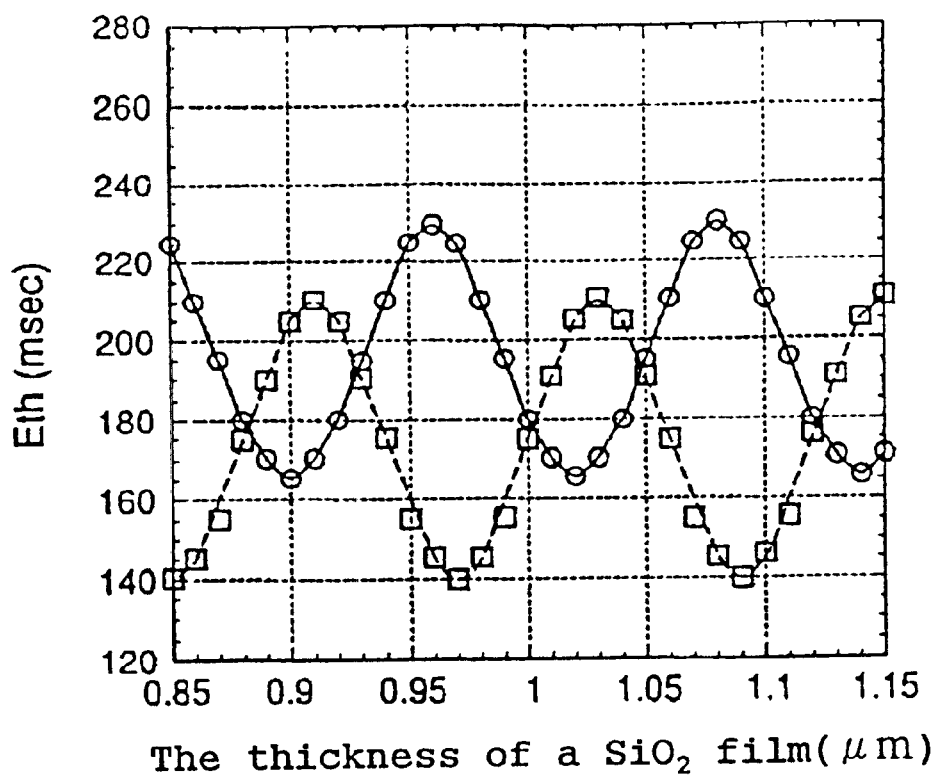
FIG. 7 is a graph showing a relationship between the thickness of an $SiO_2$ film and the Eth of a resist film.

First, referring to FIG. 4, an underlayer transparent film 3 of $SiO_2$ was formed to a thickness of about 1 μm by means of the CVD method using, for example, a silane gas on a substrate 1 of Si wafer having a gate electrode 2 of about 0.2 μm thickness formed thereon.

Then, commercially available resists 4 (PFI-38 manufactured by Sumitomo Chemical Company, Limited, with a refractive index of 1.645) was applied with various thicknesses from 0.97 μm to 1.08 μm on the underlayer transparent film 3 by the spin coating method.

Further, a commercially available antireflection film 5 (AZ-AQUATAR manufactured by Clariant K. K., with a refractive index of 1.41) was applied with a thickness of 0.064 μm on the resist film 4 by means of the spin coating method.

Subsequently, the resist film 4 was exposed by using a mask having a desired pattern and an i-line beam stepper with NA=0.57 from above the antireflection film 5, followed by development to form a contact hole having a line width of 0.4 μm on the resist film 4. Here, the development was carried out by using a commercially available NMD-W (manufactured by Tokyo Ohka Kogyo Co., Ltd.) During this development, the antireflection film 5 could be removed simultaneously by means of the developer solution, since the antireflection film 5 was formed of a water-soluble material.

The stationary, wave effect of the resist film and the variation (3σ) in the line width of the contact hole thus formed were measured. The results are shown in Table 1.

TABLE 1

| Thickness of Antireflection film (μm) | Thickness of resist film (μm) | Stationary wave effect (msec) | Variation in line width (3σ) (μm) |
| --- | --- | --- | --- |
| 0.064 | 0.97 | 50 | 0.040 |
| 0.064 | 1.00 | 30 | 0.025 |
| 0.064 | 1.02 | 36 | 0.031 |
| 0.064 | 1.05 | 58 | 0.048 |
| 0.064 | 1.08 | 52 | 0.044 |

From Table 1, it will be understood that, if the thickness of the antireflection film was 0.064 μm, the stationary wave effect and the line width variation (3σ) attained the smallest values when the thickness of the resist film was 1.00 μm.

As shown and described above, according to the present invention, the stationary wave effect may be reduced to the utmost extent, the line width variation of the resist film may be suppressed in exposing/developing the resist film, and the dimension controllability of the resist pattern may be improved by setting the thicknesses of the resist film and the antireflection film. to be specific values if the antireflection film is present, and by setting the thickness of the resist film to be a specific value if the antireflection film is not present, irrespective of the thickness of the underlayer transparent film. This may realize miniaturization and quality improvement of a semiconductor device.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

What I claim is:

1. A method for forming a resist pattern with a high dimension of controllability, the method comprising:
    forming an underlayer transparent film on a semiconductor substrate;
    forming a resist film on the underlayer transparent film to a thickness set to be $m \cdot \lambda/2n_2$, where $\lambda$ is an exposure wavelength, $n_2$ is a refractive index of the resist film, and m is an integer from 5 to 30;
    applying a water-soluble antireflection film on the resist film to a thickness set to be $\lambda/4n_1$, where $n_1$ is a refractive index of the water-soluble antireflection film; and
    exposing the resist film from above the water-soluble antireflection film using a beam having a wavelength $\lambda$ and developing the resist film, and removing the water-soluble antireflection film.

2. The method of claim 1, wherein the beam having a wavelength $\lambda$ is a g-line beam, an i-line beam, a KrF beam, or an ArF beam.

3. The method of claim 1, wherein the refractive index $n_2$ of the resist film is 1.63 to 1.67.

4. The method of claim 1, wherein the resist film has a thickness of 0.55 to 3.30 nm.

5. The method of claim 1, wherein the refractive index $n_1$ of the water-soluble antireflection film is 1.4 to 1.5.

6. The method of claim 1, wherein the water-soluble antireflection film has a thickness of 60 to 70 nm.

7. The method of claim 1, wherein the underlayer transparent film has a thickness that exhibits a light-quenching factor of 0.01 or less with respect to the exposure wavelength $\mu$.

8. The method of claim 1, wherein the underlayer transparent film has a thickness of 5 μm or less.

9. The method of claim 1, wherein the underlayer transparent film is an $SiO_x$ film or an $Si_yN_z$ film.

10. A method for forming a resist pattern with a high dimension of controllability, comprising:

forming an underlayer transparent film on a semiconductor substrate;

forming a resist film on the underlayer transparent film to a thickness set to be $(2m+1)\cdot\lambda/4n_2$, where $\lambda$ is an exposure wavelength, $n_2$ is a refractive index of the resist film, and m is an integer from 5 to 30;

exposing by a beam having a wavelength $\lambda$ and developing the resist film; and where no anti-reflection film is ever provided on the resist film.

11. The method of claim 10, wherein the beam having a wavelength $\lambda$ is a g-line beam:, an i-line beam, a KrF beam, or an ArF beam.

12. The method of claim 10, wherein the refractive index $n_2$ of the resist film is 1.63 to 1.67.

13. The method of claim 10, wherein the resist film has a thickness of 0.55 to 3.30 nm.

14. The method of. claim 10, wherein the underlayer transparent film has a thickness that exhibits a light-quenching factor of 0.01 or less with respect to the exposure wavelength $\lambda$.

15. The method of claim 10, wherein the underlayer transparent film has a thickness of 5 μm or less.

16. The method of claim 10, wherein the underlayer transparent film is an $SiO_x$ film or an $Si_yN_z$ film.

* * * * *